US011942169B2

(12) United States Patent
Su et al.

(10) Patent No.: US 11,942,169 B2
(45) Date of Patent: *Mar. 26, 2024

(54) SEMICONDUCTOR MEMORY STRUCTURE

(71) Applicant: Taiwan Semiconductor Manufacturing Co., Ltd., Hsinchu (TW)

(72) Inventors: Hsin-Wen Su, Hsinchu (TW); Kian-Long Lim, Hsinchu (TW); Wen-Chun Keng, Hsinchu County (TW); Chang-Ta Yang, Hsinchu (TW); Shih-Hao Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/813,891

(22) Filed: Jul. 20, 2022

(65) Prior Publication Data

US 2022/0359026 A1 Nov. 10, 2022

Related U.S. Application Data

(63) Continuation of application No. 16/837,227, filed on Apr. 1, 2020, now Pat. No. 11,462,282.

(51) Int. Cl.
*G11C 17/18* (2006.01)
*G11C 7/18* (2006.01)
*H10B 20/00* (2023.01)

(52) U.S. Cl.
CPC ............... *G11C 17/18* (2013.01); *G11C 7/18* (2013.01); *H10B 20/00* (2023.02)

(58) Field of Classification Search
CPC .......... G11C 17/18; G11C 7/18; H01L 27/112
USPC ...................................... 365/94, 104
See application file for complete search history.

(56) References Cited

U.S. PATENT DOCUMENTS

| 5,804,477 | A |   | 9/1998 | Lien |
| 6,016,174 | A | * | 1/2000 | Endo .................... G02F 1/1368 |
|           |   |   |        | 257/59 |
| 6,271,542 | B1 |  | 8/2001 | Emma et al. |
| 6,355,550 | B1 |  | 3/2002 | Parris et al. |

(Continued)

FOREIGN PATENT DOCUMENTS

| CN | 101217147 A | 7/2008 |
| CN | 107026118 A | 8/2017 |

(Continued)

*Primary Examiner* — Michael T Tran
(74) *Attorney, Agent, or Firm* — Haynes and Boone, LLP

(57) ABSTRACT

A semiconductor memory device includes a first word line formed over a first active region. In some embodiments, a first metal line is disposed over and perpendicular to the first word line, where the first metal line is electrically connected to the first word line using a first conductive via, and where the first conductive via is disposed over the first active region. In some examples, the semiconductor memory device further includes a second metal line and a third metal line both parallel to the first metal line and disposed on opposing sides of the first metal line, where the second metal line is electrically connected to a source/drain region of the first active region using a second conductive via, and where the third metal line is electrically connected to the source/drain region of the first active region using a third conductive via.

20 Claims, 7 Drawing Sheets

(56) References Cited

U.S. PATENT DOCUMENTS

| | | |
|---|---|---|
| 6,437,411 B1 | 8/2002 | Choi et al. |
| 6,882,576 B2 | 4/2005 | Tomita |
| 7,064,362 B2* | 6/2006 | Roy .................. H01L 27/14603 |
| | | 257/292 |
| 7,413,913 B2 | 8/2008 | Maruyama et al. |
| 7,843,747 B2 | 11/2010 | Hsueh et al. |
| 8,247,861 B2 | 8/2012 | Tempel et al. |
| 8,416,600 B2 | 4/2013 | Lin et al. |
| 9,036,404 B2* | 5/2015 | Liaw ..................... G06F 30/394 |
| | | 365/156 |
| 9,349,462 B1* | 5/2016 | Shirota .............. G11C 16/3459 |
| 9,412,800 B2* | 8/2016 | Kim .................... H01L 27/3265 |
| 9,536,827 B1 | 1/2017 | Chen et al. |
| 9,634,017 B1 | 4/2017 | Baars et al. |
| 9,659,635 B1 | 5/2017 | Liaw |
| 9,697,882 B1 | 7/2017 | Evans, Jr. et al. |
| 9,865,609 B2 | 1/2018 | Chen et al. |
| 10,121,882 B1* | 11/2018 | Ho .................. H01L 21/823481 |
| 10,580,733 B2* | 3/2020 | Kim ....................... H01L 23/528 |
| 10,832,778 B1* | 11/2020 | Yang ..................... G11C 16/344 |
| 10,839,915 B1* | 11/2020 | Yang ....................... G11C 16/30 |
| 10,983,634 B2* | 4/2021 | Tang ..................... G06F 3/0412 |
| 2001/0050386 A1 | 12/2001 | Suzuki et al. |
| 2002/0168813 A1 | 11/2002 | Ogura et al. |
| 2003/0020397 A1 | 1/2003 | Beatty |
| 2004/0097018 A1 | 5/2004 | Lee et al. |
| 2004/0108531 A1 | 6/2004 | Murayama |
| 2004/0125253 A1 | 7/2004 | Kim et al. |
| 2004/0173836 A1 | 9/2004 | Oh et al. |
| 2004/0212023 A1* | 10/2004 | Umezawa .............. H10B 41/30 |
| | | 257/315 |
| 2005/0045919 A1 | 3/2005 | Kaeriyama et al. |
| 2006/0114030 A1* | 6/2006 | Yang ........................ H03K 3/00 |
| | | 326/101 |
| 2006/0209585 A1 | 9/2006 | Tanizaki et al. |
| 2006/0261342 A1 | 11/2006 | Wells |
| 2007/0023822 A1 | 2/2007 | Sung et al. |
| 2007/0026712 A1 | 2/2007 | Yoon et al. |
| 2007/0176214 A1 | 8/2007 | Kwon et al. |
| 2008/0116496 A1 | 5/2008 | Tzeng et al. |
| 2009/0067220 A1* | 3/2009 | Asayama ............... G11C 11/412 |
| | | 365/182 |
| 2010/0144106 A1 | 6/2010 | Cho et al. |
| 2011/0155988 A1 | 6/2011 | Ohba et al. |
| 2011/0292715 A1 | 12/2011 | Ishihara et al. |
| 2012/0044758 A1 | 2/2012 | Chung |
| 2012/0181660 A1 | 7/2012 | Fujiwara |
| 2012/0273747 A1 | 11/2012 | Saitoh et al. |
| 2013/0034957 A1 | 2/2013 | Miyata |
| 2013/0044537 A1 | 2/2013 | Ishigaki et al. |
| 2013/0258749 A1 | 10/2013 | Liaw |
| 2013/0320427 A1 | 12/2013 | Loh et al. |
| 2014/0001532 A1 | 1/2014 | Sakamoto |
| 2014/0110787 A1 | 4/2014 | Wen et al. |
| 2014/0126291 A1* | 5/2014 | Mihnea .................. G11C 16/10 |
| | | 365/185.17 |
| 2014/0175563 A1 | 6/2014 | Satou |
| 2015/0079743 A1 | 3/2015 | Pachamuthu et al. |
| 2015/0162328 A1 | 6/2015 | Wang et al. |
| 2015/0280121 A1 | 10/2015 | Liao et al. |
| 2015/0311219 A1* | 10/2015 | Taniguchi ............. H01L 29/788 |
| | | 257/300 |
| 2015/0357032 A1* | 12/2015 | Tatsumura ........... G11C 13/003 |
| | | 365/72 |
| 2016/0078922 A1 | 3/2016 | Liaw |
| 2016/0126248 A1 | 5/2016 | Rabkin |
| 2016/0148705 A1 | 5/2016 | Lee et al. |
| 2016/0181255 A1 | 6/2016 | Nii |
| 2017/0084829 A1 | 3/2017 | Lee et al. |
| 2017/0154671 A1 | 6/2017 | Liaw |
| 2017/0154686 A1 | 6/2017 | Liaw et al. |
| 2017/0179154 A1 | 6/2017 | Furihata et al. |
| 2017/0213843 A1* | 7/2017 | Choi ....................... H10B 41/40 |
| 2018/0227521 A1 | 8/2018 | Keung et al. |
| 2019/0043569 A1 | 2/2019 | Chen et al. |
| 2019/0043883 A1 | 2/2019 | Xu et al. |
| 2019/0096895 A1 | 3/2019 | Huang et al. |
| 2019/0123162 A1 | 4/2019 | Xie et al. |
| 2019/0148226 A1 | 5/2019 | Yim et al. |
| 2019/0164952 A1* | 5/2019 | Chang .................. H01L 27/0886 |
| 2019/0165145 A1* | 5/2019 | Ghani ............... H01L 21/02532 |
| 2019/0206882 A1 | 7/2019 | MacPeak |
| 2019/0304900 A1 | 10/2019 | Chen et al. |
| 2020/0027871 A1 | 1/2020 | Lu |
| 2020/0074041 A1 | 3/2020 | Chen et al. |
| 2020/0091157 A1 | 3/2020 | Nakatsuji et al. |
| 2020/0105940 A1 | 4/2020 | Majhi et al. |
| 2020/0194668 A1 | 6/2020 | Sato |
| 2020/0243136 A1* | 7/2020 | Pirovano ............. G11C 13/0004 |
| 2020/0273867 A1* | 8/2020 | Manipatruni ...... G11C 14/0027 |
| 2020/0328154 A1 | 10/2020 | Jiang et al. |
| 2020/0357870 A1* | 11/2020 | Cheng .................. H01L 27/3248 |
| 2020/0357929 A1 | 11/2020 | Le et al. |
| 2020/0395460 A1 | 12/2020 | Haratipour et al. |
| 2020/0403007 A1 | 12/2020 | Thomson et al. |
| 2020/0411535 A1 | 12/2020 | Wang et al. |
| 2021/0005617 A1 | 1/2021 | Kai et al. |
| 2021/0043725 A1* | 2/2021 | Li ....................... H01L 29/66492 |
| 2021/0057421 A1* | 2/2021 | Liaw ..................... H01L 27/1104 |
| 2021/0074365 A1* | 3/2021 | Dinh ....................... G11C 7/1042 |
| 2021/0082776 A1 | 3/2021 | Wong et al. |
| 2021/0082812 A1* | 3/2021 | Chang .................. H01L 23/5256 |
| 2021/0082813 A1 | 3/2021 | Chuang et al. |
| 2021/0083065 A1* | 3/2021 | Chang ................ H01L 29/42316 |
| 2021/0111179 A1 | 4/2021 | Shivaraman et al. |
| 2021/0118882 A1 | 4/2021 | Tsai et al. |
| 2021/0125654 A1* | 4/2021 | Endoh ................. G11C 11/1655 |
| 2021/0202465 A1* | 7/2021 | Wang ............. H01L 21/823814 |
| 2021/0225823 A1* | 7/2021 | Liang ..................... H01L 25/167 |
| 2021/0233985 A1* | 7/2021 | Tang ........................ H10K 71/00 |
| 2021/0257393 A1* | 8/2021 | Yuan ..................... H01L 27/127 |
| 2021/0327904 A1* | 10/2021 | Li ........................... H10K 77/10 |
| 2021/0358977 A1* | 11/2021 | Zhang ................ H01L 27/1225 |
| 2021/0375702 A1* | 12/2021 | Xiao ....................... G09G 3/006 |
| 2022/0399417 A1* | 12/2022 | Mou ..................... H10K 59/126 |

FOREIGN PATENT DOCUMENTS

| | | | |
|---|---|---|---|
| CN | 110785843 A | | 2/2020 |
| CN | 111066087 A | * | 4/2020 ......... G11C 11/5628 |
| DE | 10156742 A1 | | 6/2003 |
| KR | 20150131915 A | | 11/2015 |
| KR | 20170063325 A | | 6/2017 |

* cited by examiner

SEMICONDUCTOR MEMORY STRUCTURE

CROSS-REFERENCE TO RELATED APPLICATION

This application is a continuation of U.S. patent application Ser. No. 16/837,227, filed Apr. 1, 2020, now U.S. Pat. No. 11,462,282, the entirety of which is incorporated by reference herein.

BACKGROUND

Among semiconductor memory devices, non-volatile memory (NVM) devices can be used to store data even if power to the memory device is turned off. In various examples, NVM devices may include read only memory (ROM), magnetic memory, optical memory, or flash memory, among other types of NVM devices. Different types of NVM devices may be programmed once, a few times, or many times. NVM devices that are programmed once, after which they cannot be rewritten, are referred to as one-time programmable (OTP) NVM devices. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology.

Regardless of the technology used to implement an OTP NVM device, cell current ($I_{cell}$) plays an important role in NVM device operation. By way of example, degraded cell current may result in device failure (e.g., such as read failure). Further, it is known that a program word line (WLP) voltage is correlated to the cell current. In some examples, increased gate resistance may cause an undesirable parasitic voltage drop that results in a degraded WLP voltage for a given memory cell, which can result in degraded cell current and device failure.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
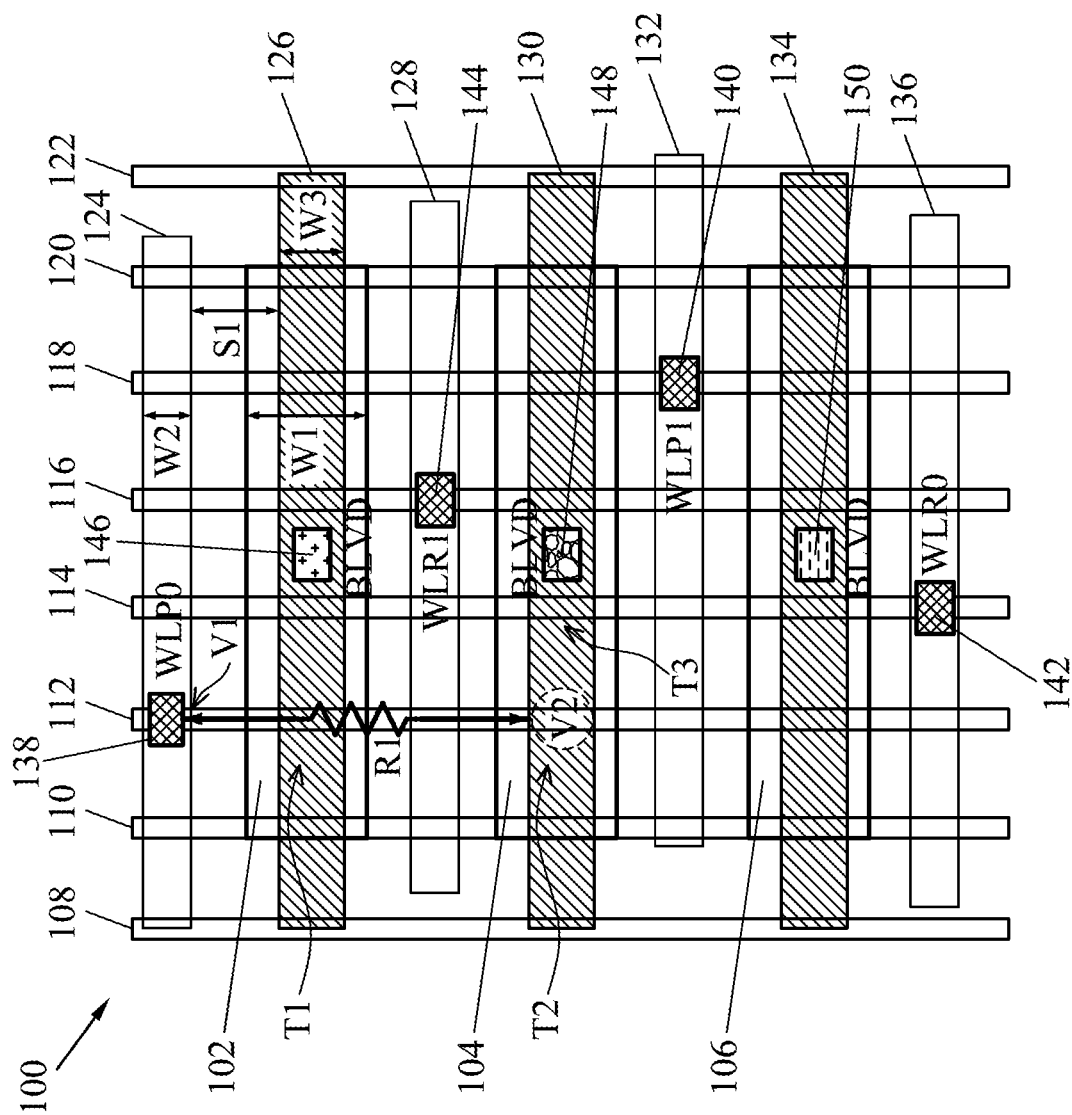
FIG. 1 is a layout view of a semiconductor memory structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Among semiconductor memory devices, non-volatile memory (NVM) devices can be used to store data even if power to the memory device is turned off. NVM devices may include read only memory (ROM), magnetic memory, optical memory, or flash memory, where various types of NVM devices may be programmed once, a few times, or many times. NVM devices that are programmed once, after which they cannot be rewritten, are referred to as one-time programmable (OTP) NVM devices. OTP NVM devices are often used for embedded NVM applications because of their compatibility to existing processes, scalability, reliability, and security. Depending on the target application, device requirements, or process requirements, OTP NVM devices may be implemented using floating gate, e-fuse, or antifuse technology. Regardless of the technology used to implement an OTP NVM device, cell current ($I_{cell}$) plays an important role in NVM device operation, as discussed in more detail below.

In various examples, electrical connections to individual NVM devices may be formed during a back-end-of-line (BEOL) fabrication process. In a BEOL process, a network of conductive metal interconnect layers (e.g., such as copper) is formed to connect various components of a semiconductor integrated circuit (IC). The network of conductive metal interconnect layers is formed within an interlayer dielectric (ILD) material that may include a low-K dielectric material. The ILD material electrically isolates adjacent metal interconnect layers from each other, both within a given interconnect level and between adjacent levels of interconnect layers. By way of example, damascene processes such as single damascene processes and dual-damascene processes are routinely used for fabricating multi-level interconnect structures. In a damascene process, trenches and via holes are formed inside and through an ILD layer, and filled with a conductive material (e.g., such as copper or a copper-based alloy), to create metallization lines and vertical conductive paths (vias) between adjacent interconnect layers.

Referring now to the example of FIG. 1, illustrated therein is a layout view of a semiconductor memory structure 100. The semiconductor memory structure 100 may include active regions 102, 104, 106. In some cases, the active regions 102, 104, 106 may include fin structures, used to form a fin field-effect transistor (FinFET). In some examples, the active regions 102, 104, 106 may also include doped regions, such as doped semiconductor regions, within which transistor source/drain regions may be formed. In some cases, an ion implantation process may be used to introduce a dopant species into a semiconductor substrate within the active regions 102, 104, 106. In various cases, the active regions 102, 104, 106 may be disposed at a same elevation as each other, for example, within a same substrate layer or conductive layer. In some embodiments, the active regions 102, 104, 106 have a width 'W1' of about 50-70 nm.

In some embodiments, the semiconductor memory structure 100 is formed on a semiconductor substrate that may include a silicon substrate, and may include various layers, including conductive or insulating layers formed on the substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include a silicon-on-insulator (SOI) structure, and/or the substrate may have other suitable enhancement features.

In various examples, isolation regions such as shallow trench isolation (STI) regions may be formed on the semiconductor substrate to isolate neighboring devices (e.g., transistors, NVM devices, etc.) from one another. Such isolation regions may be composed of silicon oxide, silicon nitride, silicon oxynitride, fluorine-doped silicate glass (FSG), a low-k dielectric, combinations thereof, and/or other suitable material known in the art. In an embodiment, the isolation regions are formed by etching trenches in the substrate. The trenches may then be filled with isolating material, followed by a chemical mechanical polishing (CMP) process. However, other embodiments are possible. In some embodiments, the isolation regions may include a multi-layer structure, for example, having one or more liner layers.

The semiconductor memory structure 100 may also include gate structures 108, 110, 112, 114, 116, 118, 120, 122. As shown, at least some of the gate structures are formed over the active regions 102, 104, 106. By way of example, an array of transistors may be formed at intersections of the gate structures and the active regions 102, 104, 106 (e.g., such as transistors T1 and T2, noted in FIG. 1), where the array of transistors may form an NMV memory array. Thus, in various cases, the gate structures may function as word lines of the memory array.

In some embodiments, the gate structures 108, 110, 112, 114, 116, 118, 120, 122 may include a gate dielectric and a gate electrode disposed on the gate dielectric. In some embodiments, the gate dielectric may include an interfacial layer such as silicon oxide layer ($SiO_2$) or silicon oxynitride (SiON). In some examples, the gate dielectric includes a high-K dielectric layer such as hafnium oxide ($HfO_2$). Alternatively, the high-K dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In still other embodiments, the gate dielectric may include silicon dioxide or other suitable dielectric. In various embodiments, the gate electrode includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some embodiments, the gate electrode may alternately or additionally include a polysilicon layer. In some embodiments, sidewall spacers are formed on sidewalls of the gate structures. Such sidewall spacers may include a dielectric material such as silicon oxide, silicon nitride, silicon carbide, silicon oxynitride, or combinations thereof.

The semiconductor memory structure 100 further includes metal lines 124, 126, 128, 130, 132, 134, 136 formed within a same conductive/interconnect layer. In some embodiments, the metal lines may be formed within a metal-0 (M0) interconnect layer. The metal lines may include copper, aluminum, or other appropriate metal or metal alloy. As illustrated in FIG. 1, metal line 124 may be electrically connected to underlying gate structure 112 by a conductive via 138 to provide a first program word line (WLP0) node, and metal line 132 may be electrically connected to underlying gate structure 118 by a conductive via 140 to provide a second program word line (WLP1) node. Further, metal line 136 may be electrically connected to underlying gate structure 114 by a conductive via 142 to provide a first read word line (WLR0) node, and metal line 128 may be electrically connected to underlying gate structure 116 by a conductive via 144 to provide a second read word line (WLR1) node. By way of example, the metal lines 124, 128, 132, 136 may have a width 'W2' of about 30-50 nm. In some cases, an area of the conductive vias 138, 140, 142, 144 is about 50-200 $nm^2$.

In some examples, metal line 126 may be electrically connected to underlying active region 102 (e.g., which may include an underlying source/drain region) by a conductive via 146, metal line 130 may be electrically connected to underlying active region 104 by a conductive via 148, and metal line 134 may be electrically connected to underlying active region 106 by a conductive via 150. Thus, the metal lines 126, 130, 134 may function as bit lines of the memory array. In some embodiments, the bit lines (the metal lines 126, 130, 134) have a width 'W3' of about 50-70 nm. In some cases, an area of the conductive vias 146, 148, 150 is about 400-700 $nm^2$. Additionally, in some embodiments, a spacing 'S1' between the metal lines connected to the gate structures and adjacent bit lines (e.g., such as between the metal lines 124 and 126) is about 40-75 nm.

As previously noted, cell current ($I_{cell}$) plays an important role in NVM device operation, and degraded cell current may result in device failure (e.g., such as read failure). It is known that a word line program (WLP) voltage is correlated to the cell current. Further, in some examples, increased gate resistance may cause an undesirable parasitic voltage drop that results in a degraded WLP voltage for a given device in the memory array, which can result in degraded cell current and device failure. With reference to the example of FIG. 1, consider a case where a programming voltage 'V1' is applied at the WLP0 node. In some examples, the applied programming voltage 'V1' may be sufficient to program a first bit at the transistor T1. However, due at least partly to the highly scaled dimensions of advanced semiconductor technologies, a significant word line resistance 'R1' may exist between the WLP0 node and the transistor T2. In some embodiments, the resistance 'R1' may be equal to or greater than about 10 kiloohms (kΩ). The resistance 'R1' may particularly cause a drop in the applied programming voltage 'V1', such that a word line program voltage 'V2' at the transistor T2 is less than 'V1', and such that the voltage 'V2' is insufficient to program a second bit at the transistor T2. As a result of the failed programming of the transistor T2, a subsequent read operation of the transistor T2 will also fail. In various cases, the above problems associated with increased word line resistance may occur when an applied WLP voltage is used to program two or more bits (e.g., two or more transistors along a given word line).

Figure 2:
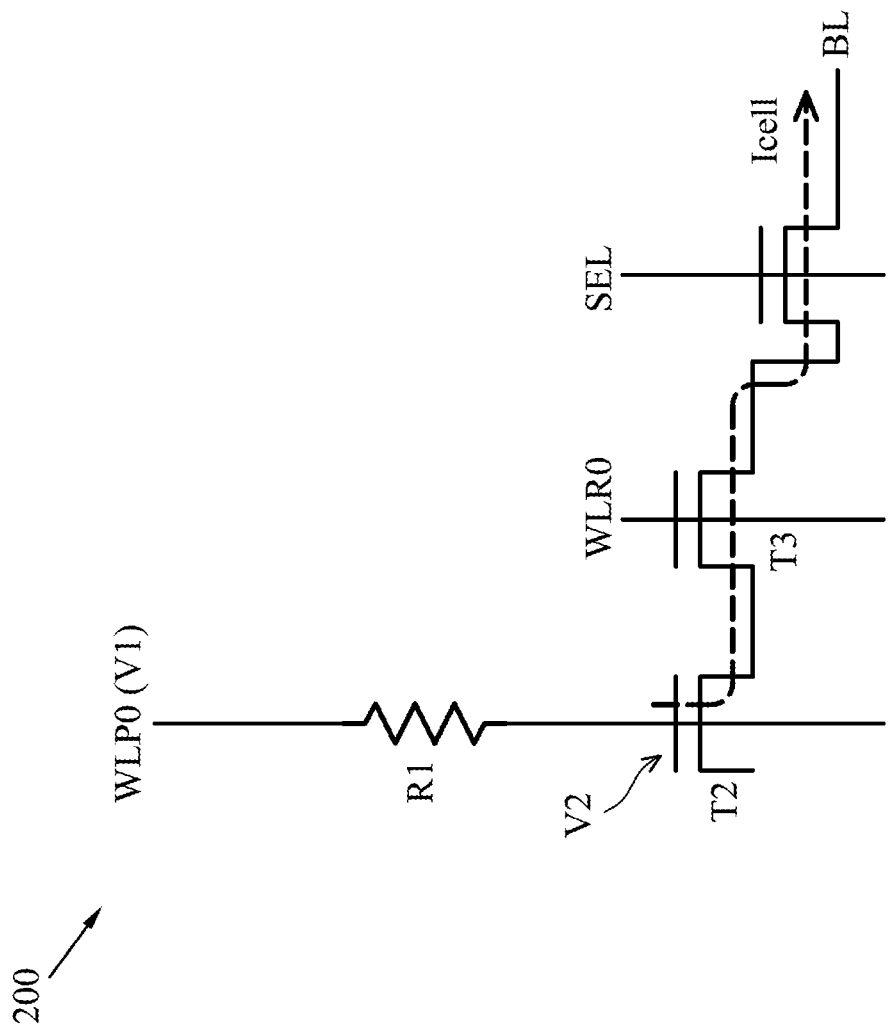
FIG. 2 illustrates a circuit diagram of an equivalent circuit of a portion of the semiconductor memory structure of FIG. 1.

FIG. 2 illustrates a circuit diagram 200 of an equivalent circuit of a portion of the semiconductor memory structure 100. For example, the circuit diagram 200 shows the WLP0 node (where the programming voltage 'V1' is applied), the word line resistance 'R1', and the degraded voltage 'V2' at the gate of the transistor T2. The circuit diagram 200 also shows the first read word line (WLR0) node at a gate of a transistor T3, a select 'SEL' gate input, and a bit line node 'BL' (e.g., conductive via 148 connected to metal line 130). As noted above, and because of the word line resistance 'R1', the voltage 'V2' may be insufficient to program the transistor T2. Thus, in some embodiments, a subsequent read operation of the transistor T2 will result in a degraded cell current ($I_{cell}$) and read failure. In various embodiments, the cell current ($I_{cell}$) may also be degraded due to the single bit line (e.g., metal line 126) and the single bit line contact (e.g., conductive via 146), which themselves suffer from increased resistance due to their highly scaled dimensions.

Embodiments of the present disclosure offer advantages over the existing art, though it is understood that other embodiments may offer different advantages, not all advantages are necessarily discussed herein, and no particular advantage is required for all embodiments. For example, embodiments discussed herein include a semiconductor memory structure having a design that provides a program word line (WLP) and a read word line (WLR) gate connection directly over an active region and including an independent word line for each bit, thus reducing an effective gate resistance (or an effective word line resistance). In various embodiments, the disclosed semiconductor memory structure also includes a plurality of bit lines and a plurality of bit line contacts to the underlying active region, for each bit, thus reducing the effective bit line resistance. As a result of the disclosed semiconductor memory structure design, the effective gate resistance is reduced by over an order of magnitude, and the cell current ($I_{cell}$) is expected to improve by about 1.3×. In some examples, the reduced gate resistance provides for a substantially negligible parasitic voltage drop that ensures a high quality WLP voltage for a given device in a memory array. Moreover, the enhanced cell current provides for more reliable NVM device operation. In some embodiments, the semiconductor memory structure disclosed herein includes an OTP NVM device. However, in some cases, the semiconductor memory structure may in some cases include other types of NVM devices. Additional details of embodiments of the present disclosure are provided below, and additional benefits and/or other advantages will become apparent to those skilled in the art having benefit of the present disclosure.

Figure 3:
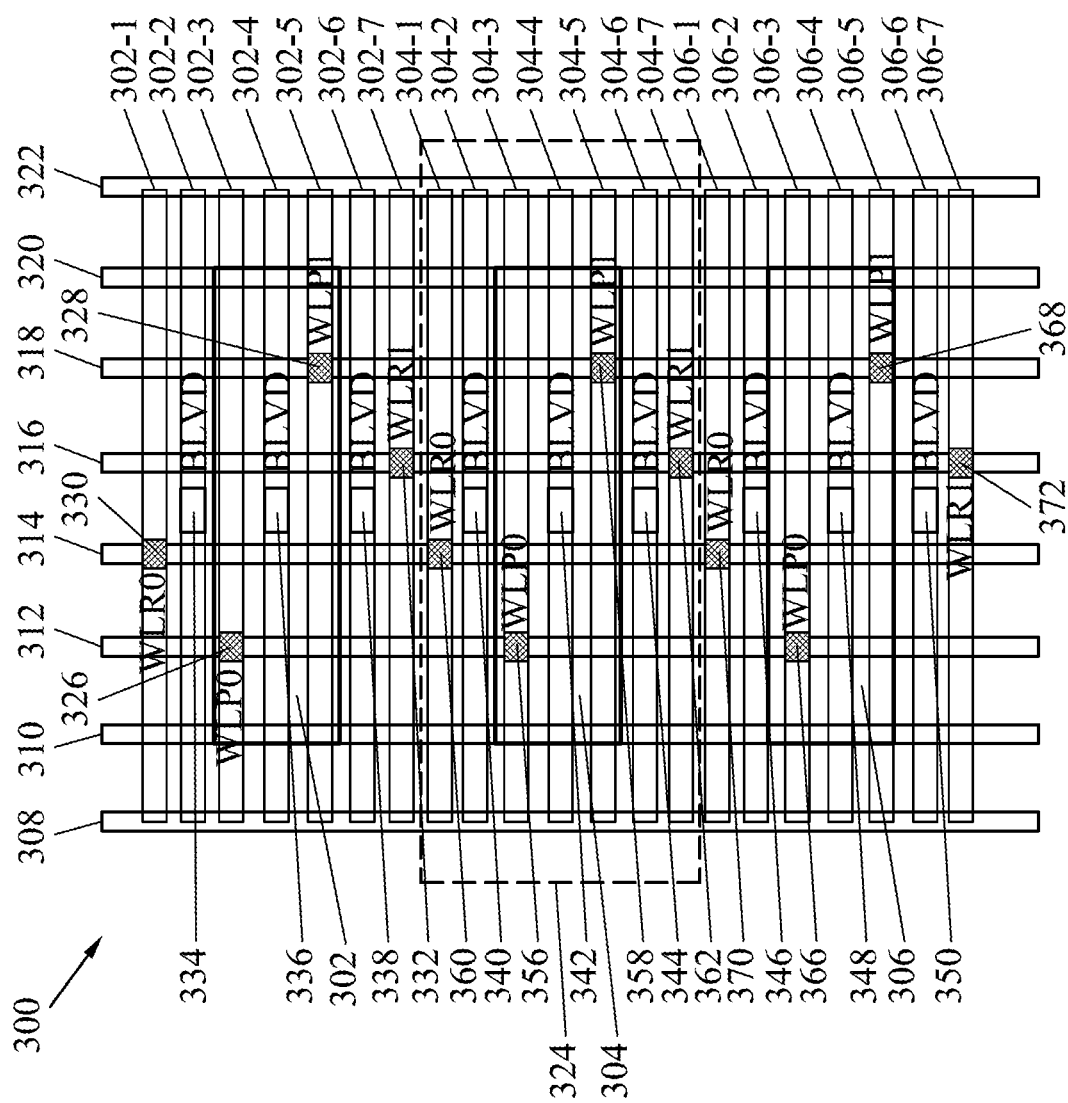
FIG. 3 is a layout view of a semiconductor memory structure, according to some embodiments.

Referring now to FIG. 3, illustrated is a layout view of a semiconductor memory structure 300, in accordance with some embodiments. The semiconductor memory structure 300 may include active regions 302, 304, 306. In some cases, the active regions 302, 304, 306 may include fin structures, used to form a FinFET. In some examples, the active regions 302, 304, 306 may also include doped regions, such as doped semiconductor regions, within which transistor source/drain regions may be formed, as described above. In various cases, the active regions 302, 304, 306 may be disposed at a same elevation as each other, for example, within a same substrate layer or conductive layer. In some embodiments, the active regions 302, 304, 306 have a width 'W1' in a range of about 60-150 nm.

In some embodiments, the semiconductor memory structure 300 is formed on a semiconductor substrate, similar to the substrate discussed above with reference to the semiconductor memory structure 100. The semiconductor memory structure 300 may also include isolation regions (e.g., such as STI regions) formed on the semiconductor substrate to isolate neighboring devices (e.g., transistors, NVM devices, etc.) from one another.

The semiconductor memory structure 300 may also include gate structures 308, 310, 312, 314, 316, 318, 320, 322. As shown, at least some of the gate structures are formed over the active regions 302, 304, 306. By way of example, an array of transistors may be formed at intersections of the gate structures and the active regions 302, 304, 306, where the array of transistors may form an NMV memory array. Thus, in various cases, the gate structures may function as word lines of the memory array. In some embodiments, the gate structures 308, 310, 312, 314, 316, 318, 320, 322 may include a gate dielectric, a gate electrode disposed on the gate dielectric, and sidewall spacers, as discussed above.

In contrast to the semiconductor memory structure 100, which included seven metal lines (metal lines 124, 126, 128, 130, 132, 134, 136) across three different active regions 102, 104, 106, the semiconductor memory structure 300 in some embodiments includes seven metal lines for each of the active regions 302, 304, 306, to reduce effective gate resistance and bit line resistance, as discussed in more detail below. For example, as shown in FIG. 3, the semiconductor memory structure 300 includes metal lines 302-1, 302-2, 302-3, 302-4, 302-5, 302-6, 302-7 formed within a same conductive/interconnect layer (e.g., such as within a M0 interconnect layer), each of which is associated with the active region 302. Similarly, the semiconductor memory structure 300 includes metal lines 304-1, 304-2, 304-3, 304-4, 304-5, 304-6, 304-7 formed within a same conductive/interconnect layer (each of which is associated with the active region 304) and metal lines 306-1, 306-2, 306-3, 306-4, 306-5, 306-6, 306-7 formed within a same conductive/interconnect layer (each of which is associated with the active region 306). The metal lines associated with each of the active regions 302, 304, 306 may include copper, aluminum, or other appropriate metal or metal alloy. As discussed below, a width and spacing of the metal lines has been scaled down to provide a plurality of bit lines and bit line contacts, connected to each active region 302, 304, 306, to reduce bit line resistance. Moreover, as discussed below, each of the active regions 302, 304, 306 include their own WLP and WLR gate connections (denoted as WLP0, WLP1, WLR0, and WLR1 for each of the active regions 302, 304, 306) to reduce gate resistance (or word line resistance) and ensure proper NVM device operation. By providing dedicated WLP and WLR gate connections for each of the active regions 302, 304, 306, the problems associated with high word line resistance (e.g., degraded programming voltage) can be mitigated. For instance, in some embodiments, the dedicated WLP gate connection may be used to program a single bit (a single transistor) along a given word line, thus ensuring that the bit it properly programmed.

As illustrated in FIG. 3, and with respect to the active region 302, metal line 302-3 may be electrically connected to underlying gate structure 312 by a conductive via 326 to provide a first program word line (WLP0) node, and metal line 302-5 may be electrically connected to underlying gate structure 318 by a conductive via 328 to provide a second program word line (WLP1) node. Further, metal line 302-1 may be electrically connected to underlying gate structure 314 by a conductive via 330 to provide a first read word line (WLR0) node, and metal line 302-7 may be electrically connected to underlying gate structure 316 by a conductive via 332 to provide a second read word line (WLR1) node.

With respect to the active region 304, metal line 304-3 may be electrically connected to underlying gate structure 312 by a conductive via 356 to provide a first program word line (WLP0) node, and metal line 304-5 may be electrically connected to underlying gate structure 318 by a conductive via 358 to provide a second program word line (WLP1) node. Further, metal line 304-1 may be electrically connected to underlying gate structure 314 by a conductive via 360 to provide a first read word line (WLR0) node, and metal line 304-7 may be electrically connected to underlying gate structure 316 by a conductive via 362 to provide a second read word line (WLR1) node.

Referring to the active region 306, metal line 306-3 may be electrically connected to underlying gate structure 312 by a conductive via 366 to provide a first program word line (WLP0) node, and metal line 306-5 may be electrically connected to underlying gate structure 318 by a conductive via 368 to provide a second program word line (WLP1) node. Further, metal line 306-1 may be electrically connected to underlying gate structure 314 by a conductive via 370 to provide a first read word line (WLR0) node, and metal line 306-7 may be electrically connected to underlying gate structure 316 by a conductive via 372 to provide a second read word line (WLR1) node.

With respect to the bit lines, metal lines 302-2, 302-4, 302-6 may be electrically connected to underlying active region 302 (e.g., which may include an underlying source/drain region) by conductive vias 334, 336, 338, respectively, metal lines 304-2, 304-4, 304-6 may be electrically connected to underlying active region 304 (e.g., which may include an underlying source/drain region) by conductive vias 340, 342, 344, respectively, and metal lines 306-2, 306-4, 306-6 may be electrically connected to underlying active region 306 (e.g., which may include an underlying source/drain region) by conductive vias 346, 348, 350, respectively. Connections of the metal lines to the underlying active regions 302, 304, 306, by way of the various conductive vias, is further illustrated below with reference to FIG. 7. The metal lines 302-2, 302-4, 302-6 may thus function as bit lines of the memory device associated with the active region 302, the metal lines 304-2, 304-4, 304-6 may function as bit lines of the memory device associated with the active region 304, and the metal lines 306-2, 306-4, 306-6 may function as bit lines of the memory device associated with the active region 306. By providing a plurality of bit lines and bit line contacts, for each of the active regions 302, 304, 306, bit line resistance is reduced.

Figure 4:
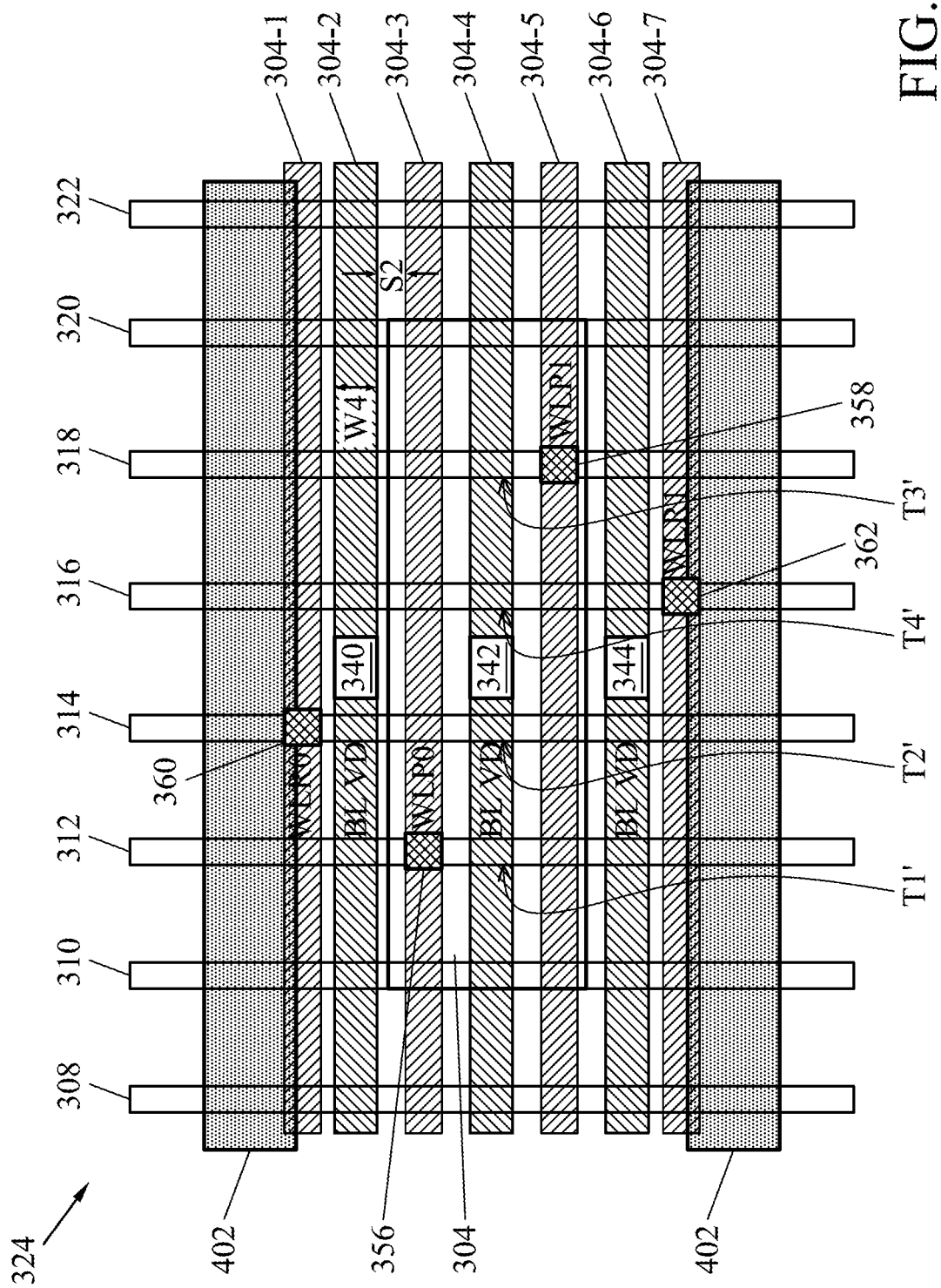
FIG. 4 provides a view of a portion of the semiconductor memory structure of FIG. 3, in accordance with some embodiments.

FIG. 4 provides an enlarged view of a portion 324 of the semiconductor memory structure 300. In some embodiments, the portion 324 may be described as a memory cell of the semiconductor memory structure 300. Thus, by way of example, the semiconductor memory structure 300 shown in FIG. 3 may include a memory cell array. The portion 324 illustrates the gate structures 308, 310, 312, 314, 316, 318, 320, 322, the active region 304, and the metal lines 304-1, 304-2, 304-3, 304-4, 304-5, 304-6, 304-7 formed within a same conductive/interconnect layer (e.g., such as within the M0 layer), as well as the program word line nodes (WLP0, WLP1) and the read word line nodes (WLR0, WLR1) associated with the active region 304. FIG. 4 also illustrates cut metal regions 402. In some examples, the cut metal regions 402 include dielectric regions that are used to electrically isolate metal layers that contact source/drain regions of neighboring active regions (e.g., such as active regions 302, 304, 306).

In some embodiments, and still with reference to FIG. 4, each of the metal lines 304-1, 304-2, 304-3, 304-4, 304-5, 304-6, 304-7 (as well as the corresponding metal lines associated with active regions 302, 306) has a width 'W4' of about 10-30 nm, and a spacing 'S2' between adjacent metal lines is about 10-30 nm. In some cases, an area of the conductive vias 356, 358, 360, 362 contacting the word lines (as well as the corresponding conductive vias associated with WLP0, WLP1 and WLR0, WLR1 of the active regions 302, 306) is about 50-200 nm². In some cases, an area of the conductive vias 340, 342, 344 (as well as the corresponding conductive vias associated with the bit lines of the active regions 302, 306) is about 400-700 nm². In contrast to the dimensions of the metal lines discussed above with reference to the semiconductor memory structure 100, the width and spacing of the metal lines associated with the semiconductor memory structure 300 have been scaled down to provide a plurality of bit lines and bit line contacts, connected to each active region 302, 304, 306, to reduce bit line resistance.

Figure 5:
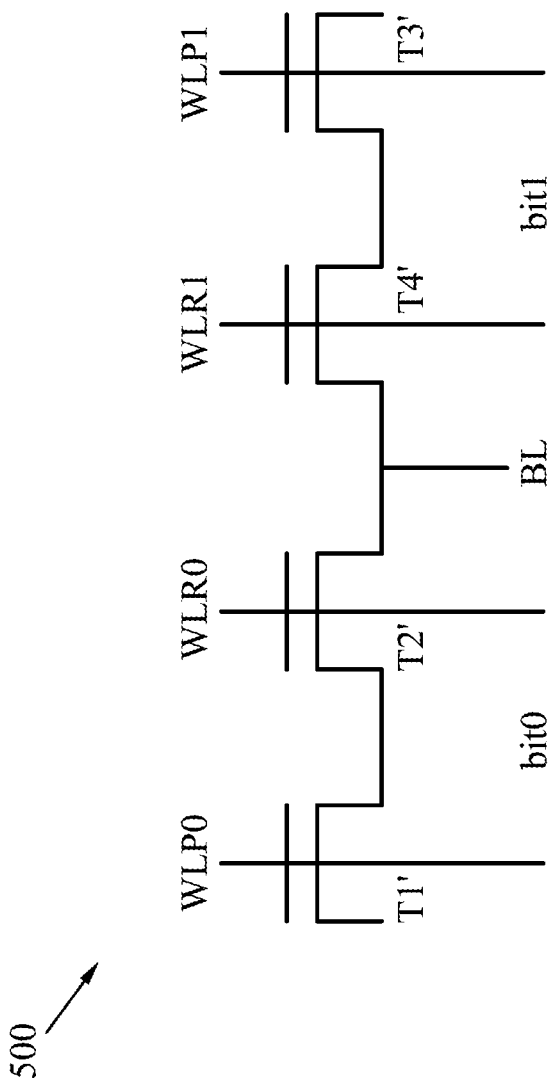
FIG. 5 illustrates a circuit diagram of an equivalent circuit of the portion of the semiconductor memory structure shown in FIG. 4, according to some embodiments.

FIG. 5 illustrates a circuit diagram 500 of an equivalent circuit of the portion 324 of the semiconductor memory structure 300. For example, the circuit diagram 500 shows the WLP0 node at a gate of a transistor T1', the WLR0 node at a gate of a transistor T2', the WLP1 node at a gate of a transistor T3', the WLR1 node at a gate of a transistor T4', and a bit line node 'BL' (e.g., conductive vias 340, 342, 344 connected to metal lines 304-2, 304-4, 304-6, respectively). In some embodiments, the circuit of FIG. 5 may be used to reliably store two bits, 'bit0' that corresponds to WLP0 and WLR0, and 'bit1' that corresponds to WLP1 and WLR1.

Figure 6:
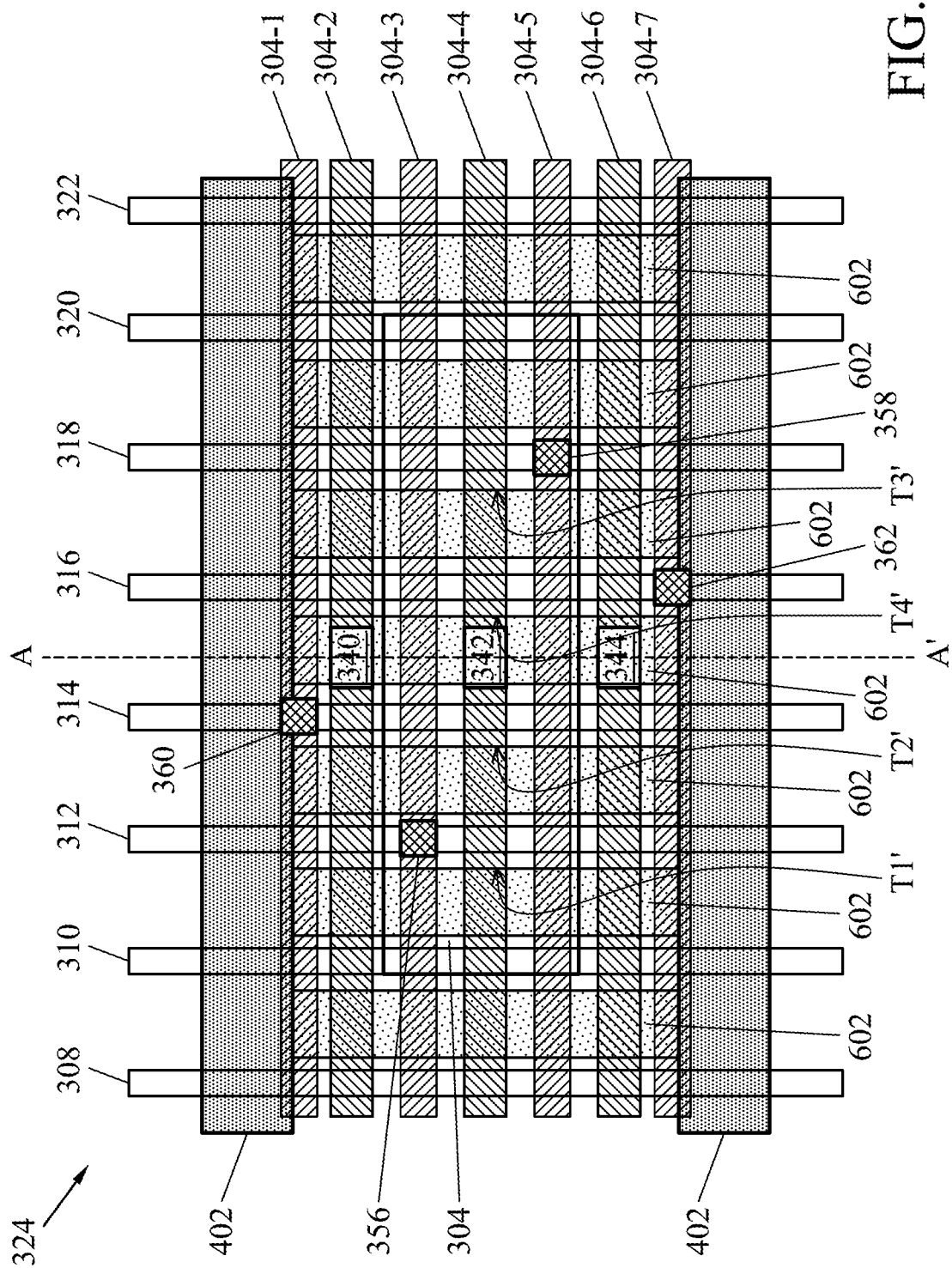
FIG. 6 provides a view of a portion of the semiconductor memory structure of FIG. 3, further including source/drain metal layers, in accordance with some embodiments.
Figure 7:
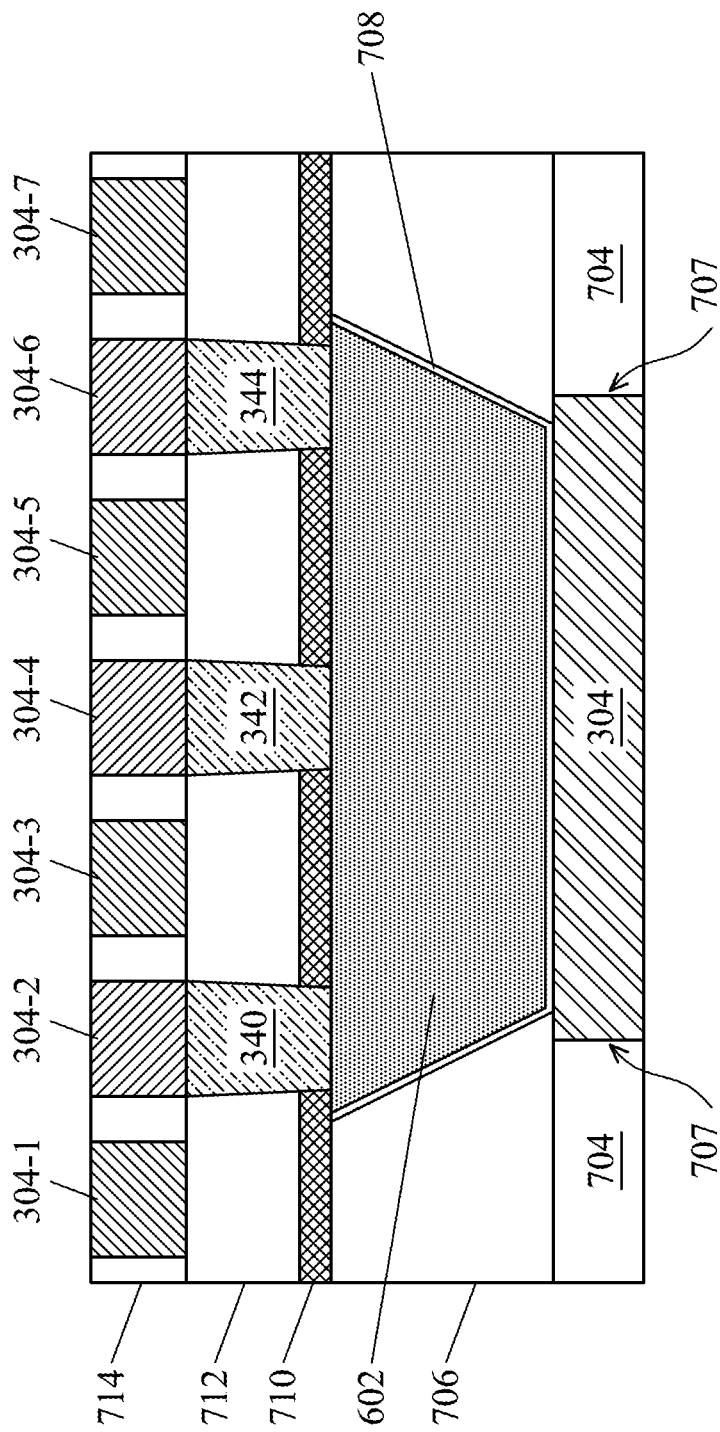
FIG. 7 provides a cross-sectional view of the semiconductor memory structure of FIG. 6 along a plane substantially parallel to a plane defined by section AA' of FIG. 6, in accordance with some embodiments.

Reference is now made to FIGS. 6 and 7, which provide further detail regarding the configuration of the semiconductor memory structure 300. FIG. 6 provides an enlarged view of the portion 324, similar to FIG. 4, of the semiconductor memory structure 300. However, FIG. 6 also illustrates metal layers 602, which are used to contact source/drain regions within the active region (e.g., such as the active regions 302, 304, 306). Thus, in some embodiments, the metal layers 602 may be referred to as source/drain contacts or source/drain contact metal layers. By way of example, the cut metal regions 402 may be used to electrically isolate the metal layers 602 contacting source/drain regions of neighboring active regions (e.g., such as active regions 302, 304, 306). FIG. 7 provides a cross-sectional view of the semiconductor memory structure 300 along a plane substantially parallel to a plane defined by the section AA' of FIG. 6.

With reference to FIG. 7, the cross-sectional view along the section AA' of the semiconductor memory structure 300 provides a view of the bit line contacts to the underlying active region. In particular, the section AA' illustrates the active region 304, which may include a source/drain region. In some embodiments, isolation regions 704 (e.g., such as STI regions) may be formed adjacent to the active region 304 to isolate neighboring active regions or devices (e.g., transistors, NVM devices, etc.) from one another. In embodiments where the semiconductor memory structure 300 includes FinFET devices, the active region 304 may include a fin structure having an epitaxial source/drain feature formed in, on, and/or surrounding the fin structure. FIG. 7 also illustrates a first inter-layer dielectric (ILD) layer 706, within which an opening may be formed (e.g., by a suitable combination of lithography and etching) for subsequent deposition of a source/drain contact metal (e.g., the metal layer 602). By way of example, the first ILD layer 706 may include materials such as tetraethylorthosilicate (TEOS) oxide, undoped silicate glass, or doped silicon oxide such as borophosphosilicate glass (BPSG), fluorosilicate glass (FSG), phosphosilicate glass (PSG), boron doped silicon glass (BSG), and/or other suitable dielectric materials.

In various embodiments, the metal layer 602 may be formed within an opening of the first ILD layer 706 to provide an electrical contact to the active region 304 (e.g., including the source/drain region). In some examples, the metal layer 602 may include W, Cu, Co, Ru, Al, Rh, Mo, Ta, Ti, TiN, TaN, WN, silicides, or other suitable conductive material. In some cases, a silicidation process may be performed, prior to formation of the metal layer 602, to provide a silicide layer interposing the active region 304 and the metal layer 602 to provide a low resistance contact. In some examples, a glue or barrier layer 708 may be formed on sidewall surfaces of the opening of the first ILD layer 706 within which the metal layer 602 is formed. In some cases, the glue or barrier layer 708 may include Ti, TiN, Ta, TaN, W, or other appropriate material.

In some embodiments, the metal layer 602 may have tapered sidewall profiles as shown in FIG. 7, where top portions of the tapered sidewalls may extend laterally beyond a plane defined by a lateral edge 707 of the active region 304. In some examples, and because portions of the metal layer 602 may extend beyond the lateral edge 707 the active region 304, conductive vias (e.g., such as conductive vias 340, 344) and the respective metal lines to which the conductive vias are connected (e.g., such as metal lines 304-2 and 304-6) will reliably provide an electrical connection to the metal layer 602 even if the conductive vias and their respective metal lines are themselves disposed partially or fully outside/beyond the plane defined by the lateral edge 707 of the active region 304. In some cases, epitaxial source/drain features formed in, on, and/or surrounding the fin structure (of a FinFET device) may be grown such that they extend laterally beyond the plane defined by a lateral edge 707 of the active region 304. In such cases, the metal layer 602 may or may not have tapered sidewall profiles, and the metal layer 602 may be formed over the epitaxial source/drain features, including over portions of the epitaxial source/drain features that extend beyond the plane defined by the lateral edge 707 of the active region 304. Thus, once again, because portions of the metal layer 602 may extend beyond the lateral edge 707 the active region 304, conductive vias and the respective metal lines to which the conductive vias are connected will reliably provide an electrical connection to the metal layer 602 even if the conductive vias and their respective metal lines are disposed partially or fully outside/beyond the plane defined by the lateral edge 707 of the active region 304.

As further shown in FIG. 7, a contact etch stop layer (CESL) 710 is formed over the metal layer 602, and a second ILD layer 712 is formed over the CESL 710. By way of example, the CESL 710 may include Ti, TiN, TiC, TiCN, Ta, TaN, TaC, TaCN, W, WN, WC, WCN, TiAl, TiAlN, TiAlC, TiAlCN, or combinations thereof. In some embodiments, the second ILD layer 712 may be substantially the same as the first ILD layer 706 described above. Contact via openings may be formed (e.g., by a suitable combination of lithography and etching), for example within the second ILD layer 712 and the CESL 710, for subsequent deposition of a contact via metal layer (also referred to as conductive vias). For instance, the conductive vias 340, 342, 344 may be formed within such contact via openings to provide electrical contact to the metal layer 602 (e.g., the source/drain contact). In some cases, the conductive vias 340, 342, 344 (as well as the other conductive vias discussed herein) may include W, Cu, Co, Ru, Al, Rh, Mo, Ta, Ti, or other conductive material.

In some embodiments, a third ILD layer 714 is formed over the second ILD layer 712 and over the conductive vias 340, 342, 344. In some embodiments, the third ILD layer 714 may be substantially the same as the first ILD layer 706 described above. Further, while the second ILD layer 712 and the third ILD layer 714 are shown as separate ILD layers, in some cases the second and third ILD layers 712, 714 may be formed as a single layer. In various embodiments, metal line openings may be formed (e.g., by a suitable combination of lithography and etching), for example within the third ILD layer 714, for subsequent deposition of various metal interconnect lines. For example, the metal lines 304-1, 304-2, 304-3, 304-4, 304-5, 304-6, 304-7 may be formed within such metal line openings of the third ILD layer 714. FIG. 7 also illustrates that the metal lines 304-1, 304-2, 304-3, 304-4, 304-5, 304-6, 304-7 may be formed within the same conductive/interconnect layer. By way of example, the metal lines 304-2, 304-4, 304-6 are formed over, and are electrically connected to, the underlying active region 304 (e.g., the source/drain region) by the conductive vias 340, 342, 344, respectively, as well as by the metal layer 602 (e.g., the source/drain contact). In some embodiments, the metal lines 304-1, 304-2, 304-3, 304-4, 304-5, 304-6, 304-7 may include copper, aluminum, or other appropriate metal or metal alloy. It is noted that the material used to form one or more of the first ILD layer 706, the CESL 710, the second ILD layer 712, and the third ILD layer 714 may include a low-K dielectric material that electrically isolates adjacent metal layers (e.g., such as metal lines, metal contacts, and conductive vias) from each other. As discussed above, by providing the plurality of bit lines (e.g., metal lines 304-2, 304-4, 304-6) and the plurality of bit line contacts (e.g., by the plurality of conductive vias 340, 342, 344) to the underlying active region 304 (e.g., the source/drain region), the effective bit line resistance is reduced.

The various embodiments described herein offer several advantages over the existing art. It will be understood that not all advantages have been necessarily discussed herein, no particular advantage is required for all embodiments, and other embodiments may offer different advantages. As one example, embodiments discussed herein include a semiconductor memory structure having a design that provides a program word line (WLP) and a read word line (WLR) gate connection directly over an active region and including an independent word line for each bit, thus reducing an effective gate resistance (or an effective word line resistance). In various embodiments, the disclosed semiconductor memory structure also includes a plurality of bit lines and a plurality of bit line contacts to the underlying active region, for each bit, thus reducing the effective bit line resistance. As a result of the disclosed semiconductor memory structure design, the effective gate resistance is reduced by over an order of magnitude, and the cell current ($I_{cell}$) is expected to improve by about 1.3×. In some examples, the reduced gate resistance provides for a substantially negligible parasitic voltage drop that ensures a high quality WLP voltage for a given device in a memory array. Moreover, the enhanced cell current provides for more reliable NVM device operation. Thus, the various embodiments disclosed herein provide for higher quality and more robust gate connections, which further provides for improved device and circuit performance.

Thus, one of the embodiments of the present disclosure described a semiconductor device including a first gate structure formed over a first active region. In some embodiments, a first metal line is disposed over and perpendicular to the first gate structure, where the first metal line is electrically connected to the first gate structure using a first conductive via, and where the first conductive via is disposed over the first active region. In some examples, the semiconductor device further includes a second metal line and a third metal line both parallel to the first metal line and disposed on opposing sides of the first metal line, where the second metal line is electrically connected to a source/drain region of the first active region using a second conductive via, and where the third metal line is electrically connected to the source/drain region of the first active region using a third conductive via.

In another of the embodiments, discussed is a semiconductor device including a memory cell having an active region. In some embodiments, a first word line is formed over the active region, where a connection to the first word line is provided using a first conductive via disposed over the active region. In some examples, a plurality of bit lines are electrically connected to a source/drain of the active region using a respective plurality of conductive vias.

In yet another of the embodiments, discussed is a semiconductor device including a plurality of active regions corresponding to a plurality of memory cells. In some embodiments, a first program word line is formed over the plurality of active regions, where a first connection to the first program word line is provided using a first conductive via disposed over a first active region of the plurality of active regions, and where a second connection to the first program word line is provided using a second conductive via disposed over a second active region of the plurality of active regions. In some examples, a first plurality of bit lines is electrically connected to a first source/drain region of the first active region using a first plurality of conductive vias, and a second plurality of bit lines is electrically connected to a second source/drain region of the second active region using a second plurality of conductive vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive via that electrically couples a first metal line to a first gate structure in a first active region, wherein the first conductive via is disposed over the first active region; and
a second metal line parallel to the first metal line and electrically coupled to a source/drain region of the first active region by a second conductive via;
wherein the first and second metal lines are formed within a same interconnect layer; and
wherein the first active region is associated with a first memory cell including a first program word line, a second program word line, a first read word line, and a second read word line.

2. The semiconductor device of claim 1, wherein the first metal line is perpendicular to the first gate structure.

3. The semiconductor device of claim 1, further including a third metal line parallel to the first metal line and formed within the same interconnect layer, wherein the second metal line and the third metal line are disposed on different sides of the first metal line, and wherein the third metal line is electrically coupled to the source/drain region of the first active region by a third conductive via.

4. The semiconductor device of claim 3, wherein the first gate structure includes the first program word line, and wherein the second metal line and the third metal line include bit lines.

5. The semiconductor device of claim 1, wherein the same interconnect layer includes a metal-0 (M0) interconnect layer.

6. The semiconductor device of claim 3, further comprising a metal layer formed over the source/drain region of the first active region, wherein the second conductive via and the third conductive via are both formed over, and in contact with, the metal layer.

7. The semiconductor device of claim 3, wherein at least one of the second conductive via and the third conductive via is disposed over the first active region.

8. The semiconductor device of claim 1, further comprising:
a fourth conductive via that electrically couples a fourth metal line to a second gate structure in the first active region, wherein the second gate structure is parallel to the first gate structure, and wherein the fourth conductive via is disposed over the first active region.

9. The semiconductor device of claim 8, wherein the fourth metal line is perpendicular to the second gate structure, and wherein the second gate structure includes the second program word line.

10. A semiconductor device, comprising:
a memory cell including an individual active region;
a metal layer contacting an individual source/drain of the individual active region; and
a plurality of bit lines corresponding to a same bit line node and electrically connected to the individual source/drain of the individual active region using a plurality of conductive vias that are formed over, and in contact with, the metal layer, wherein at least one of the plurality of conductive vias is disposed over the individual active region.

11. The semiconductor device of claim 10, wherein a portion of the metal layer extends laterally beyond a plane defined by a lateral edge of the individual active region.

12. The semiconductor device of claim 10, further including a first conductive via that electrically couples a first metal line to a first word line using a first conductive via, wherein the first word line includes a gate structure formed over the individual active region.

13. The semiconductor device of claim 12, wherein the first metal line and the plurality of bit lines are formed within a same interconnect layer.

14. The semiconductor device of claim 10, wherein the plurality of bit lines includes at least three bit lines electrically connected to the individual source/drain of the individual active region using at least three respective conductive vias.

15. The semiconductor device of claim 12, further comprising:
a second word line formed over the individual active region, wherein a connection to the second word line is provided using a second conductive via disposed over the individual active region.

16. The semiconductor device of claim 10, wherein the memory cell includes a one-time programmable (OTP) non-volatile memory (NVM) cell.

17. A semiconductor device, comprising:
a plurality of active regions;
a program word line spanning the plurality of active regions, wherein connections to the program word line are provided by a plurality of conductive vias disposed over respective active regions of the plurality of active regions; and
a plurality of bit lines associated with each of the plurality of active regions, wherein the plurality of bit lines associated with a given active region correspond to a same bit line node and are electrically connected to a same source/drain region of the given active region using a respective set of conductive vias coupled to the plurality of bit lines associated with the given active region.

18. The semiconductor device of claim 17, wherein the respective set of conductive vias includes at least three conductive vias coupled to at least three respective bit lines of the plurality of bit lines associated with the given active region.

19. The semiconductor device of claim 17, wherein the plurality of active regions corresponds to a plurality of memory cells, and wherein the plurality of memory cells includes a plurality of one-time programmable (OTP) non-volatile memory (NVM) cells.

20. The semiconductor device of claim 1, wherein the first memory cell includes a one-time programmable (OTP) non-volatile memory (NVM) cell.

* * * * *